(12) United States Patent
Brewer

(10) Patent No.: US 6,677,799 B1
(45) Date of Patent: Jan. 13, 2004

(54) INTEGRATOR WITH HIGH GAIN AND FAST TRANSIENT RESPONSE

(75) Inventor: Robert John Brewer, Lambourn (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/925,074

(22) Filed: Aug. 8, 2001

(51) Int. Cl.[7] ................................................ H03K 3/00
(52) U.S. Cl. ........................ 327/344; 327/336; 327/112
(58) Field of Search ................................. 327/112, 336, 327/339, 344, 345, 374, 436; 330/98, 109, 302, 305, 306, 310

(56) References Cited

U.S. PATENT DOCUMENTS

| | | | |
|---|---|---|---|
| 4,205,276 A | 5/1980 | Wright et al. ............... 330/294 |
| 4,667,164 A | 5/1987 | Doluca ........................ 330/253 |
| 4,731,553 A | * 3/1988 | Van Lehn et al. ............ 326/27 |
| 5,124,663 A | 6/1992 | McEntarfer et al. ............ 330/9 |
| 5,252,868 A | 10/1993 | Miida et al. ................. 327/277 |
| 5,365,126 A | * 11/1994 | Krenik et al. ................. 326/68 |
| 5,825,250 A | 10/1998 | Tomasini et al. ........... 330/292 |
| 5,963,047 A | * 10/1999 | Kwong et al. ................ 326/27 |
| 6,087,853 A | * 7/2000 | Huber et al. .................. 326/83 |

OTHER PUBLICATIONS

Copy of patent application Ser. No. 09/897,150.

\* cited by examiner

Primary Examiner—Timothy P. Callahan
Assistant Examiner—Linh Nguyen
(74) Attorney, Agent, or Firm—Wolf, Greenfield & Sacks, P.C.

(57) ABSTRACT

A multi-stage integrator achieves a relatively high small-signal gain, broad bandwidth, and very clean transient pulse response. Only simple inverters are used, making the design scalable to deep sub-micron with low supply voltages, a rail-to-rail output swing, and a relatively low output impedance and useful tolerance to capacitive loading. A high gain amplifier is coupled between an integrator input node and amplifier output node. A broadband transconductor is coupled between the integrator input node and integrator output node. A resistor connects the amplifier output node and the integrator output, while a capacitor is coupled from the integrator input to the amplifier output. The conductance of the resistor (the reciprocal of the resistance, or 1/R) is selected to be substantially equal to the transconductance $g_m$ of the transconductor. A method for achieving clean transient pulse response is also described.

22 Claims, 5 Drawing Sheets

INTEGRATOR WITH HIGH GAIN AND FAST TRANSIENT RESPONSE

FIELD OF THE INVENTION

This invention relates generally to operational amplifiers and in particular to CMOS operational amplifiers, and is more particularly directed toward a multi-stage integrator having high gain and fast transient response.

BACKGROUND OF THE INVENTION

An op amp (operational amplifier) architecture is desirable which is suited to current and foreseeable future generations of small geometry CMOS (complementary metal-oxide-semiconductor), manufactured economically in high volume using the same processes as those used for manufacturing digital circuitry.

The conventional op amp, illustrated in FIG. 1 in block diagram form, and generally depicted by the numeral 100, comprises two gain stages. The first functions as a differential transconductance ($g_m$) stage 101 and the second as an integrator 103, separated by a differential to single-ended converter 102. The conventional op amp 100 is illustrated in more detail in FIG. 2.

As shown in FIG. 2, the $g_m$ stage 101 comprises a differential pair 201, 202 with a single current source "tail" 203 (both typically, and as an example, p-type insulated-gate field effect transistors), and two current source loads 204, 205 (typically, and as an example, provided by n-type transistors). By selecting an output 206 from only one of the differential input stages, differential to single-ended conversion is accomplished or, conventionally, current sources 204 and 205 are implemented as a mirror with single-ended output 206 derived from the high impedance side of the mirror.

This single-ended output 206 is then applied to the integrator stage 103. In the implementation shown, the integrator 103 includes a n-type output transistor 207 with a current source tail 210, and Miller capacitor 208. A nulling resistor 209 has been added for the sake of stability.

In sub-micron CMOS technology, it is difficult to achieve an integrator with a combination of high gain and wide bandwidth with a high slew rate and a good transient response to high frequency events. The active devices are fast, but a single gain stage has very low DC gain. This may be increased by techniques such as cascading, but to a limited extent; also, deep sub-micron processes have very restricted supply voltages which make it desirable to use the full voltage range efficiently without cascoding. A multi-stage integrator (typically three inverting gains) gives high gain with simple inverters, but must be stabilized with an internal nested pole, which sharply degrades the bandwidth and thus results in a poor slew rate and poor transient response.

Consequently, a need arises for an integrator implementation that provides high gain and good transient response, while offering simplicity of design and economy in overall circuit area.

SUMMARY OF THE INVENTION

These needs and others are satisfied by the present invention, in which a three-stage integrator achieves a high small-signal gain on the order of 80 dB, with 200 MHz typical bandwidth, and very clean transient pulse response. Only simple inverters are used, making the design scalable to deep sub-micron with low supply voltages, a rail-to-rail output swing, and a relatively low output impedance and useful tolerance to capacitive loading.

In accordance with one aspect of the invention, a high-gain, fast response amplifier comprises a first amplifier path including a plurality of inverters and a first amplifier path output, a second amplifier path having a common input with the first amplifier path, and including a transconductor and a second amplifier path output, and a resistor interconnecting the first and second amplifier paths to form a composite amplifier having the common input as the input thereto and the output of the second amplifier path as the output thereof.

The first amplifier path may include first and second cascaded inverters coupled to an output stage, while the second cascaded inverter may include a compensation network connected in feedback to improve stability. The compensation network may be a series RC network. In a preferred form of the invention, the amplifier further comprises a capacitor connected in feedback around the first amplifier path. The resistor interconnecting the first and second amplifier paths preferably has a conductance g equal to the transconductance $g_m$ of the transconductor.

In accordance with a further aspect of the present invention, a method is provided for minimizing high-frequency transient signals at an amplifier output. The method comprises the steps of providing an amplifier having an amplifier input and amplifier output, feeding back a sample of high frequency output signals from the amplifier output to the amplifier input, providing a secondary signal path having a common input with the amplifier input, and adding the secondary signal path output to the amplifier output to effectively remove the high-frequency transient signals.

In accordance with yet another aspect of the present invention, an integrator comprises a first signal path including multiple cascaded inverting amplifiers coupled between the integrator input and an amplifier output, a second signal path limited to a single transconductor coupled between integrator input and output, a resistor coupled between the amplifier output and the integrator output, and a capacitor coupled between the amplifier output and the integrator input. The first signal path provides a relatively high-gain, narrowband amplifier, and the second signal path provides a relatively low-gain, broadband amplifier, and the first and second signal paths sum through the resistor to form a single amplifying structure with relatively high low-frequency gain, and relatively fast high-frequency transient response.

Further objects, features, and advantages of the present invention will become apparent from the following description and drawings.

DETAILED DESCRIPTION OF THE INVENTION

Figure 1:
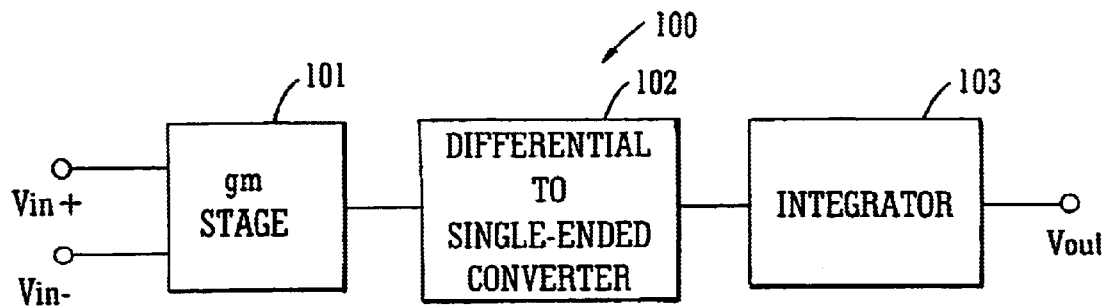
FIG. 1 depicts a conventional operational amplifier of the prior art in block diagram form.
Figure 2:
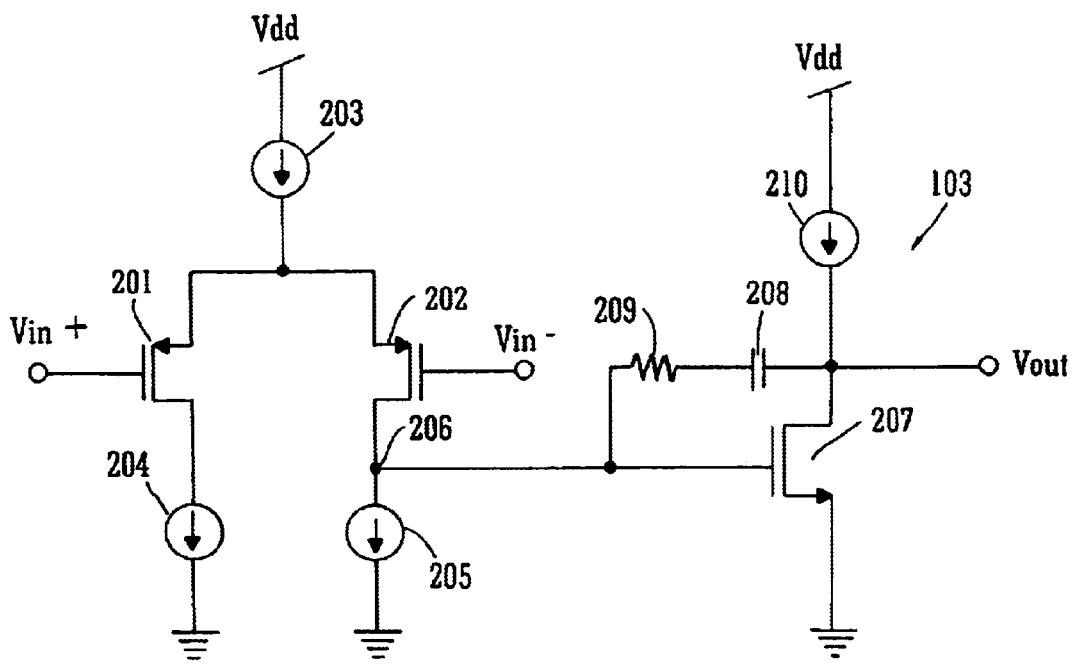
FIG. 2 is a more detailed schematic representation of the op amp of FIG. 1.
Figure 3:
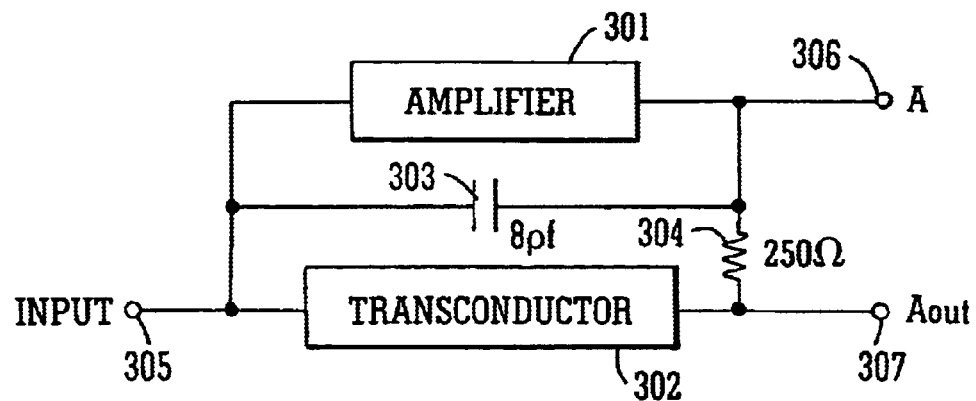
FIG. 3 depicts an integrator in accordance with the present invention.

In accordance with the present invention, a high-gain, fast response integrator is described that offers distinct advantages when compared with the prior art. FIG. 3 depicts an integrator in accordance with the present invention. A high gain amplifier 301 is coupled between an integrator input node 305 and amplifier output node A 306. A broadband transconductor is coupled between the integrator input node 305 and integrator output node 307. A resistor 304 connects the amplifier output node A 306 and the integrator output 307, while a capacitor 303 is coupled from the integrator input 305 to amplifier output 306. The conductance of the resistor 304 (the reciprocal of the resistance, or 1/R) is selected to be substantially equal to the transconductance $g_m$ of the transconductor 302.

Figure 4:
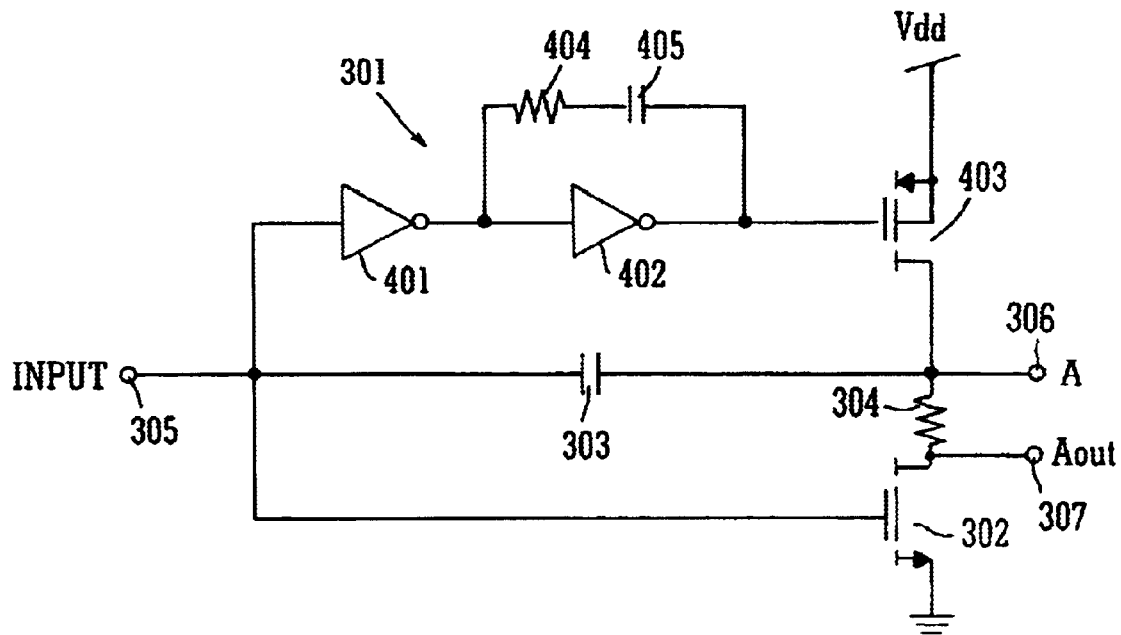
FIG. 4 illustrates the integrator of FIG. 3 in greater detail.

The diagram of FIG. 4 depicts the integrator of FIG. 3 in more detail. As can be appreciated from an examination of FIG. 4, the high gain amplifier 301 comprises simple inverter stages 401 and 402, which are analog amplifiers also commonly called inverting amplifiers, with a compensation network connected in feedback around inverter 402 to enhance stability. It will be apparent that amplifier 301, with 3 gain stages in a closed loop formed by capacitor 303, is inherently unstable. The nested compensation components 404 and 405 make this loop stable according to well-known principles. In the circuit of FIG. 4, the compensation components 404, 405 form a series-connected RC (resistor-capacitor) network.

The output of inverter 402 drives amplifier output stage 403, a p-channel enhancement mode MOSFET. The transconductor 302 is an NMOS transistor coupled between the inverter input 305 and the inverter output 307. As discussed above, resistor 304 is coupled between the high gain amplifier output 306 and the integrator output 307, with the capacitor 303 coupled between the amplifier output 306 and the integrator input 305 (the capacitor is connected as a feedback element from the amplifier output 306 to the amplifier input 305). The value of the resistor 304 is substantially equal to the reciprocal of the transconductance of the transconductor 302, or $1/g_m$.

Operation of the integrator of FIG. 4 may be understood in one of two ways. First of all, due to the propagation delay through inverter 402, there will be severe transient ringing at the amplifier output node A 306. That high frequency voltage will be fed back by capacitor 303 to the input 305. The input 305 is assumed to be high impedance because, in application, the prior stage is typically a current source output. The voltage at the amplifier output node A 306 will induce a current in resistor 304 given by its conductance g (1/R). The same voltage at the input 305 will induce a current in the transconductor 302 given by its transconductance $g_m$. If g (1/R)=$g_m$, then the integrator output 307 remains unaffected (independent of load capacitance).

In the alternative, the circuit may be regarded as two amplifying paths in parallel with common input 305 and output 307. Amplifier 301, comprising simple inverters 401 and 402 and output transistor 403, is a high-gain amplifier with low bandwidth and poor transient response. The transconductor 302 is a low-gain, high bandwidth amplifier with good transient response. The two signal paths, one through the amplifier 301 and the other through the transconductor 302, sum benignly via resistor 304 to form a single amplifying structure, or composite amplifier, with high low frequency gain and good high frequency transient response. It is noteworthy that the integrator output 307 has a low dynamic output impedance related to the transconductance of transconductor 302 ($1/g_m$), so the integrator output 307 is relatively tolerant of load capacitance.

Figure 5:
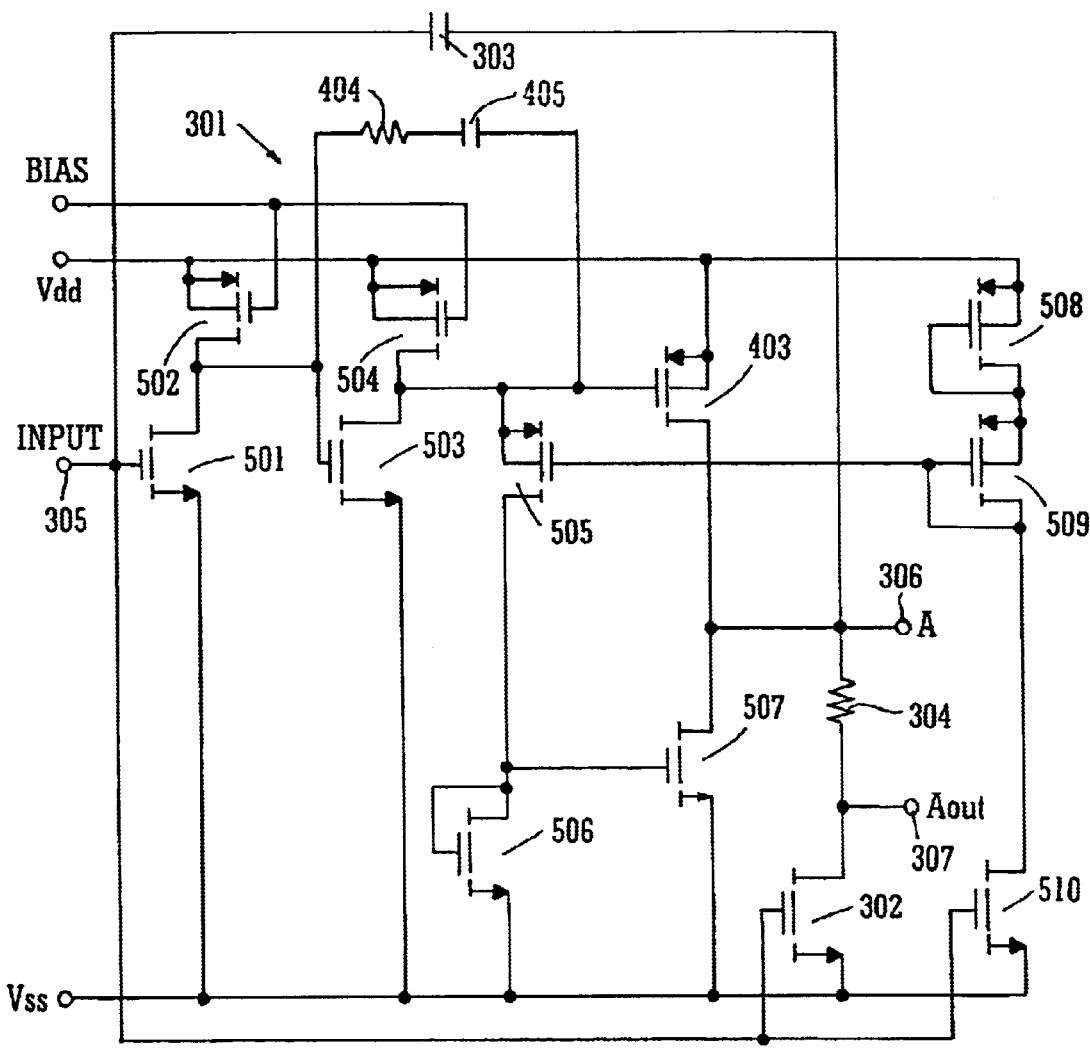
FIG. 5 is a device-level schematic diagram of the integrator of FIG. 3.
Figure 8:
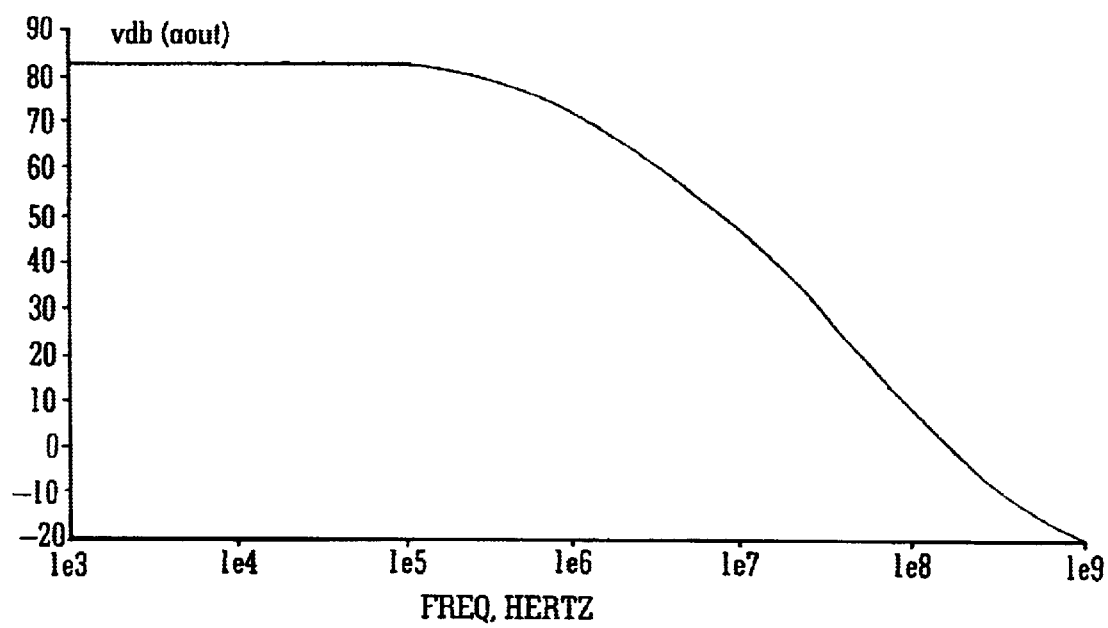
FIG. 8 shows gain versus frequency performance of an amplifier suitable for use in an integrator in accordance with the present invention.

A device level schematic for implementation of an integrator in accordance with the present invention is shown in FIG. 5. As noted above, the amplifier 301 comprises three sequential inverters 501, 503, 403, made stable by an internal nested compensation resistor 404 and capacitor 405. The third inverter 403 has (optionally) a class A/B construction to boost the output drive capability. This amplifier has a high gain, greater than 80 dB, typically (small signal), as illustrated by the gain versus frequency performance plot of FIG. 8. However, due to its nested pole, it has low bandwidth and poor transient response when the loop is closed. The transconductor 302 is a simple NMOS inverting device that has a low voltage gain but very wide bandwidth.

The bias voltage applied to transistors 502 and 504 configures them to act as constant current loads to gain devices 501 and 503. Transconductors 508, 509 and 510 are interconnected to form a constant voltage on the gate of device 505, which biases device 505 such that a proportion of the AC current flowing to the gate of device 403 is diverted to modulate the gate of device 507, thus establishing a bi-directional push-pull amplifying action.

The amplifier 301 (devices 501, 503, and 403) has a poor transient response, so that the ultimate effect at node A 306 of an applied input pulse is severe ringing. This ringing voltage causes a current to flow in the resistor 304 (to the integrator output Aout 307) proportional to the conductance of the resistor 304. The conductance of the resistor 304 is the reciprocal of its resistance, or 1/R.

This voltage will also be fed back via capacitor 303 to the integrator input 305, which conventionally will be driven from a high impedance current source, as mentioned previously. The ringing voltage thus appears on the input of the transconductor 302, and causes a current to flow from the output Aout 307 equal to the transconductance of the transconductor 302. If $g_r$=$g_m$ the currents cancel and the voltage on Aout 307 is substantially undisturbed by the ringing of the main amplifier.

Figure 9:
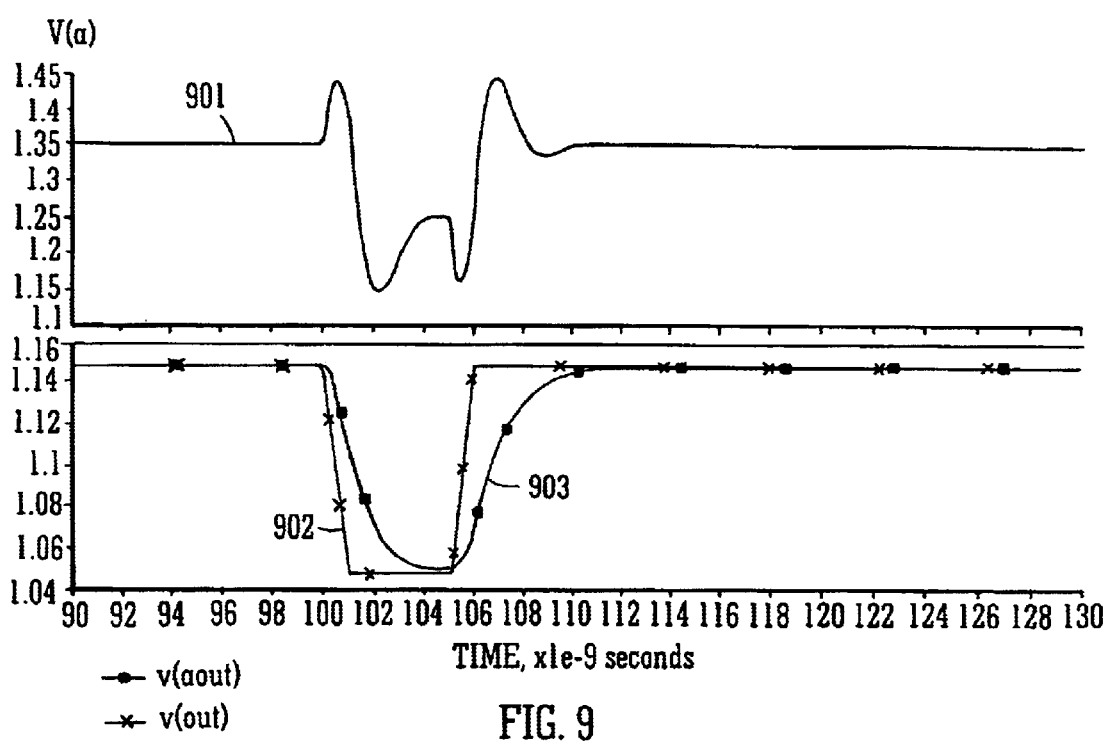
FIG. 9 illustrates pulse response timing diagrams for the integrator of FIG. 5.

This is illustrated by the pulse response timing diagrams of FIG. 9, that illustrate output waveforms in response to a 5 ns (nanosecond) input pulse. Ringing at the amplifier output is depicted in waveform 901. The transconductor 302 exhibits a fast transient response, however, so its normal pulse response is as shown in waveform 902. With feedback as described above, the pronounced ringing response of the main amplifier is effectively cancelled, and the integrator output pulse appears as shown in waveform 903.

Figure 6:
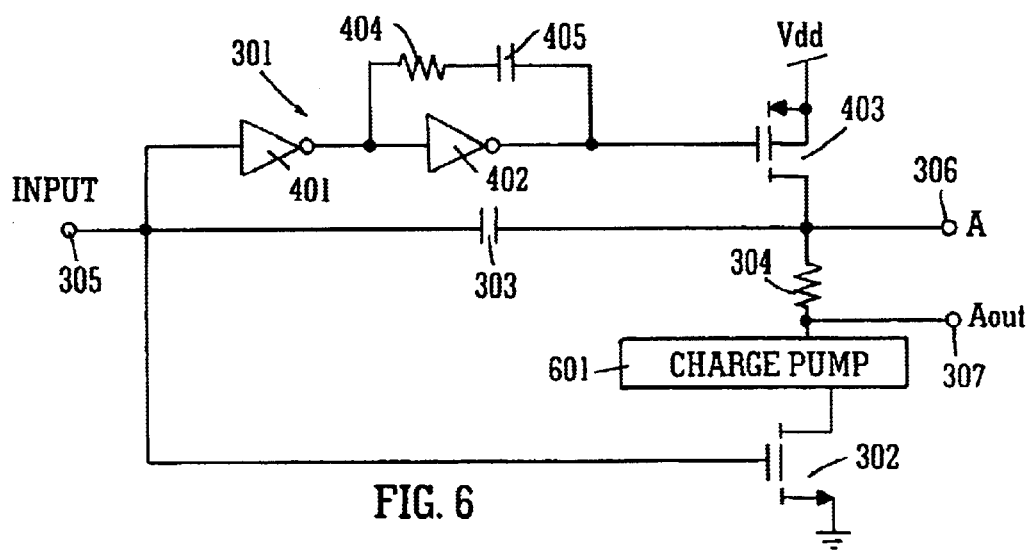
FIG. 6 is a simplified block diagram illustrating a refinement of the integrator of FIG. 3.

A further refinement that may be employed in a practical design is a charge-pumped virtual battery 601 inserted between the transconductor 302 and the resistor 304, as shown in the simplified diagram of FIG. 6. When the integrator is used in an application with a unipolar power supply, it is often desired to pull a capacitive load (an analog-to-digital converter, or ADC, for example) to ground, or even slightly below, to achieve zero code output. The simple charge-pumped virtual battery 601 achieves this by maintaining a positive voltage on the transconductor 302 drain with zero output voltage. If the charge pump's internal resistance rises with increasing output voltage, it does not over-pump the drain voltage and thus achieves an output swing from true zero to near $V_{DD}$ without increasing the voltage stress on any component beyond $V_{DD}$—important in a deep sub-micron process. In such a process, a pumping frequency in the GHz (gigahertz) range is practical, which permits pumping and smoothing capacitors of a few pf, which can be integrated on chip.

The charge pump 601 advantageously solves the following problem. It may be desirable for device 302 to be able to sink current from the output Aout 307 even when Aout is at ground voltage or even very slightly below. This may be done by means of a power supply or integrated charge pump connected to the source of device 302 to pull it to a significantly negative voltage.

However, this technique may cause difficulties in practice. Perhaps the most significant problem is that $V_{SS}$ and the IC silicon substrate are commonly connected together, which precludes pulling the source of device 302 below ground potential. Secondly, the voltage between $V_{DD}$ and $V_{SS}$ may already be at the maximum potential permitted by electrical stress reliability concerns.

Figure 7:
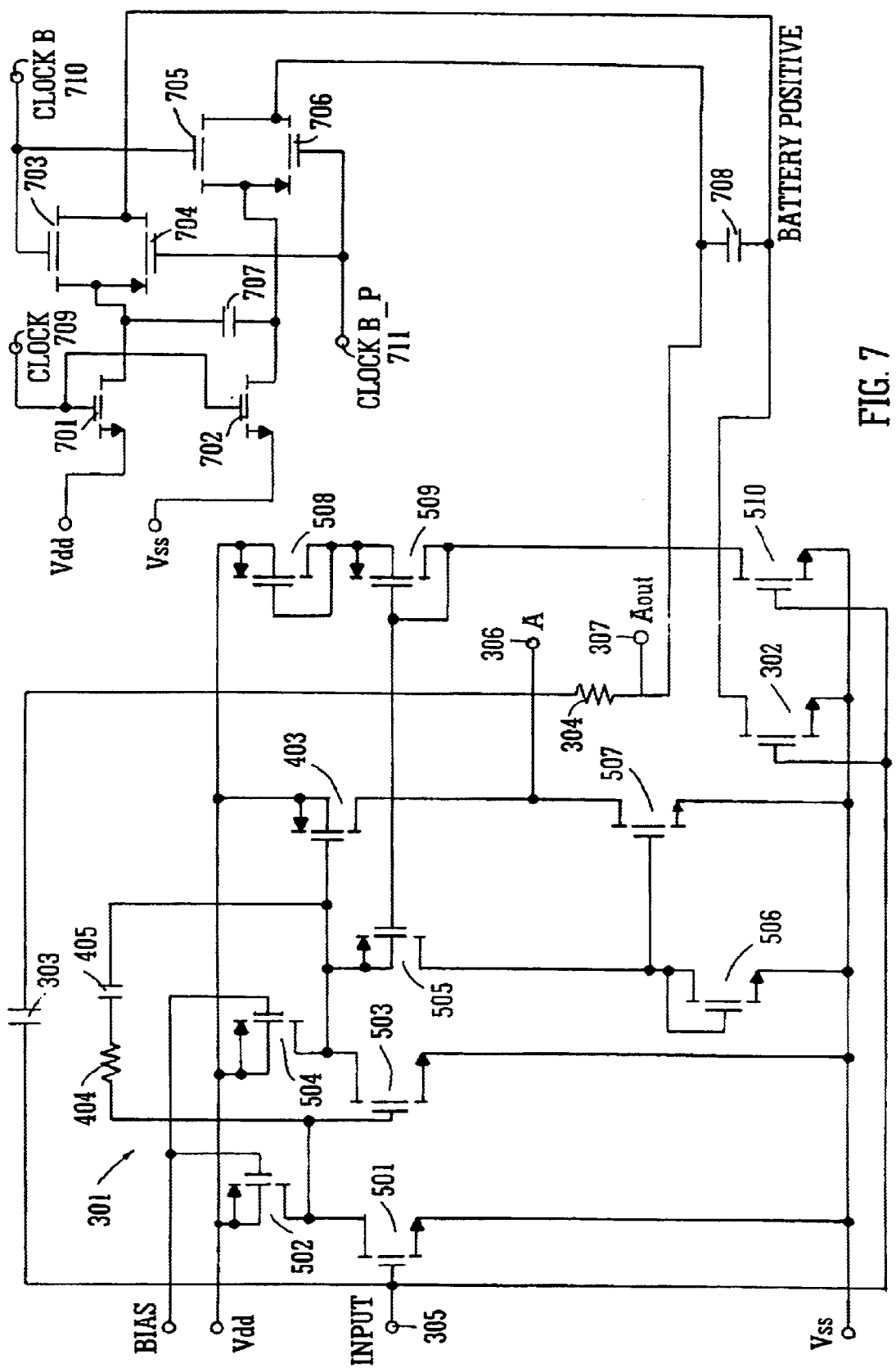
FIG. 7 is a device-level schematic diagram of the integrator of FIG. 6.

The operation of the charge pump 601 may be better appreciated through an examination of FIG. 7. Two clock phases are used, which are conventional non-overlapping 2-phase clocks, labeled 709 (CLOCK) and 710 (CLOCKB). These clocks are used to switch n-type MOS switches 701, 702, 703, 705. To switch p-type MOS switches 704 and 706 simultaneously with 703 and 705, a further clock 711 (labeled CLOCKB_P) is used, which has the same timing as CLOCKB but is inverted in polarity.

During the first clock phase (CLOCK), capacitor 707 is charged to a fixed voltage that is substantially equal to the supply voltage ($V_{DD}$—$V_{SS}$) less the threshold voltage drop across switch 701. During the second clock phase (CLOCKB), the capacitor 707 is connected across reservoir capacitor 708. This produces a charge pumping action such that, as reservoir capacitor 708 is discharged by the current flowing into device 302, it is replenished from the pump.

This circuit has the advantageous feature that device 302 can now sink current from the output Aout 307, even when Aout is at (or even very slightly below) ground potential, without requiring a negative voltage on the source of device 302. At the same time, no voltage difference within the circuit is created that exceeds $V_{DD}$-$V_{SS}$.

There has been described herein a high-gain, fast response integrator that is improved over the prior art. It will be apparent to those skilled in the art that modifications may be made without departing from the spirit and scope of the invention. Accordingly, it is not intended that the invention be limited except as may be necessary in view of the appended claims.

What is claimed is:

1. A high-gain and fast response analog amplifier comprising:
    a first analog amplifier path including a plurality of inverting amplifiers and a first amplifier path output;
    a second analog amplifier path having a common input with the first amplifier path, and a second analog amplifier path output;
    a resistor interconnecting the first and second amplifier oaths to form a composite amplifier having the common input as the input thereto and the output of the second, analog amplifier path as the output thereof; and
    a capacitor connected in feedback around the first analog amplifier path.

2. The amplifier of claim 1, wherein the first amplifier path includes first and second cascaded inverting amplifiers coupled to an output stage.

3. The amplifier of claim 1, wherein the second cascaded inverting amplifier includes a compensation network connected in feedback to improve stability.

4. The amplifier of claim 3, wherein the compensation network comprises a series RC network.

5. The amplifier of claim 1, wherein the resistor has a conductance g equal to the transconductance $g_m$ of the transconductor.

6. A method for minimizing high-frequency transient signals at an amplifier output, the method comprising the steps of:
    (a) providing an amplifier having an amplifier input and amplifier output;
    (b) feeding back a sample of high frequency output signals from the amplifier output to the amplifier input;
    (c) providing a secondary signal path having a common input with the amplifier input; and
    (d) adding the secondary signal path output to the amplifier output to effectively remove the high-frequency transient signals.

7. The method in accordance with claim 1, wherein the step of providing an amplifier further comprises providing an amplifier including a plurality of cascaded inverting amplifiers.

8. The method in accordance with claim 6, wherein the step of feeding back a sample further comprises feeding back a sample of high frequency output signals through a capacitor connected from the amplifier output to the amplifier input.

9. The method in accordance with claim 6, wherein the step of providing a secondary signal path further comprises providing a transconductor sharing a common input with the amplifier input.

10. The method in accordance with claim 9, wherein the step of adding the secondary signal path output to the amplifier output further comprises the step of adding the transconductor output to the amplifier output through a resistor having a conductance g equal to the transconductance $g_m$ of the transconductor.

11. Apparatus for minimizing high-frequency transient signals at an amplifier-output comprising:
    amplifier means having an amplifier input and amplifier output;
    feedback means for feeding back a sample of high frequency output signals from the amplifier output to the amplifier input;
    secondary signal path means having a common input with the amplifier input; and
    means for adding the secondary signal path output to the amplifier output to effectively remove the high-frequency transient signals.

12. The apparatus of claim 11, wherein the amplifier means comprises an amplifier including a plurality of cascaded inverting amplifiers.

13. The apparatus of claim 11, wherein the feedback means comprises a capacitor connected from the amplifier output to the amplifier input.

14. The apparatus of claim 11, wherein the secondary signal path means comprises a transconductor sharing a common input with the amplifier input.

15. The apparatus of claim 14, wherein the means for adding the secondary signal path output to the amplifier output comprises a resistor having a conductance g equal to the transconductance $g_m$ of the transconductor.

16. An integrator providing first and second signal paths between an integrator input and an integrator output, the integrator comprising:

the first signal path including multiple cascaded inverting amplifiers coupled between the integrator input and an amplifier output;

the second signal path limited to a single transconductor coupled between integrator input and output;

a resistor coupled between the amplifier output and the integrator output; and a capacitor coupled between the amplifier output and the integrator input;

such that the first signal path provides a relatively high-gain, narrowband amplifier, and the second signal path provides a relatively low-gain, broadband amplifier, and the first and second signal paths sum through the resistor to form a single amplifying structure with relatively high low-frequency gain, and relatively fast high-frequency transient response.

17. The integrator of claim 16, further comprising a charge-pumped virtual battery interposed between the transconductor and the resistor.

18. The integrator of claim 17, wherein the charge-pumped virtual battery includes a reservoir capacitor at its output.

19. The integrator of claim 18, wherein the charge-pumped virtual battery is driven by high-speed, bi-phase clocks.

20. The integrator of claim 19, wherein the charge-pumped virtual battery charges a first capacitor to a fixed voltage during a first clock phase, then recharges the reservoir capacitor from the first capacitor during a second clock phase.

21. The high-gain and fast response analog amplifier of claim 1 wherein the second analog amplifier path includes transconductor operatively connected to the common input and to the second analog amplifier path output.

22. The high-gain and fast response analog amplifier of claim 1 wherein:

the first analog amplifier path provides a high gain from the common input to the first amplifier path output; and the second analog amplifier path provides a broadband, lower gain response from the common input to the second analog amplifier path output.

* * * * *